(12) United States Patent
Nussbaum et al.

(10) Patent No.: US 9,054,658 B2
(45) Date of Patent: Jun. 9, 2015

(54) POWER SUPPLY WITH RECTIFIER PROTECTION

(75) Inventors: Michael Nussbaum, Newton, MA (US); Zoran Coric, Framingham, MA (US); Christopher J. Perkins, Shrewsbury, MA (US); Timothy W. Sheen, Brighton, MA (US)

(73) Assignee: Bose Corporation, Framingham, MA (US)

( * ) Notice: Subject to any disclaimer, the term of this patent is extended or adjusted under 35 U.S.C. 154(b) by 898 days.

(21) Appl. No.: 13/107,267

(22) Filed: May 13, 2011

(65) Prior Publication Data

US 2012/0288120 A1 Nov. 15, 2012

(51) Int. Cl.
H03F 99/00 (2009.01)
H03F 1/52 (2006.01)
H02M 1/32 (2007.01)
H03F 3/68 (2006.01)
H02M 1/00 (2006.01)

(52) U.S. Cl.
CPC . *H03F 1/52* (2013.01); *H02M 1/32* (2013.01); *H03F 3/68* (2013.01); *H02M 2001/008* (2013.01); *H03F 2200/03* (2013.01)

(58) Field of Classification Search
CPC ..... H02M 1/32; H02M 2001/008; H03F 3/68; H03F 1/52; H03F 2200/03; H03F 3/217; H03F 1/523; H03F 1/0227; H03F 1/0244; H03F 1/0211; H03F 2200/504; H03G 3/3042; H03G 3/004
USPC ............. 381/111, 116, 117, 120, 121, 96, 55, 381/106–108, 56, 58, 59; 330/207 P, 298, 330/127, 297
See application file for complete search history.

(56) References Cited

U.S. PATENT DOCUMENTS

| 7,432,793 | B2 | 10/2008 | Nussbaum | |
|---|---|---|---|---|
| 7,742,305 | B2 | 6/2010 | Schweigert et al. | |
| 7,986,187 | B1 | 7/2011 | Nussbaum et al. | |
| 2001/0030581 | A1* | 10/2001 | Dent | 330/297 |
| 2002/0186853 | A1* | 12/2002 | Anderson | 381/98 |
| 2004/0015163 | A1 | 1/2004 | Buysse et al. | |
| 2005/0264970 | A1 | 12/2005 | Shinobu | |
| 2009/0309658 | A1 | 12/2009 | Mendenhall | |

(Continued)

FOREIGN PATENT DOCUMENTS

| JP | 2002198756 A | 7/2002 |
|---|---|---|
| JP | 2003188660 A | 7/2003 |
| JP | 2004329930 A | 11/2004 |

(Continued)

OTHER PUBLICATIONS

Texas Instruments TAS 5142, "Stereo Digital Amplifier Power Stage," SLES126B—Dec. 2004—Revised May 2005.

(Continued)

*Primary Examiner* — Vivian Chin
*Assistant Examiner* — Friedrich W Fahnert

(57) ABSTRACT

An apparatus for driving speakers includes user-configurable amplifier cells for driving selected speakers, a synchronous rectifier circuit, and a control system. Each cell connects between power rails. The rectifier circuit provides current on the rails for consumption by the cells. The current depends on the configuration. The control system implements a model of the rectifier circuit and cells and uses it to control an audio input signal in response to information concerning electrical outputs of the amplifier cells. This indirectly limits current drawn from the synchronous rectifier circuit.

15 Claims, 9 Drawing Sheets

(56) References Cited

U.S. PATENT DOCUMENTS

2011/0215776 A1    9/2011    Sheen
2011/0215893 A1    9/2011    Nussbaum

FOREIGN PATENT DOCUMENTS

WO    2006092939 A1    9/2006
WO    2007096761 A1    8/2007

OTHER PUBLICATIONS

Japanese Office Action dated Dec. 11, 2014 for Japanese patent application No. 2014-510424.

International Search Report and Written Opinion dated Aug. 24, 2012 for International application No. PCT/US2012/037046.

International Preliminary Report on Patentability dated Nov. 28, 2013 for International application No. PCT/US2012/037046.

\* cited by examiner

FIG. 9

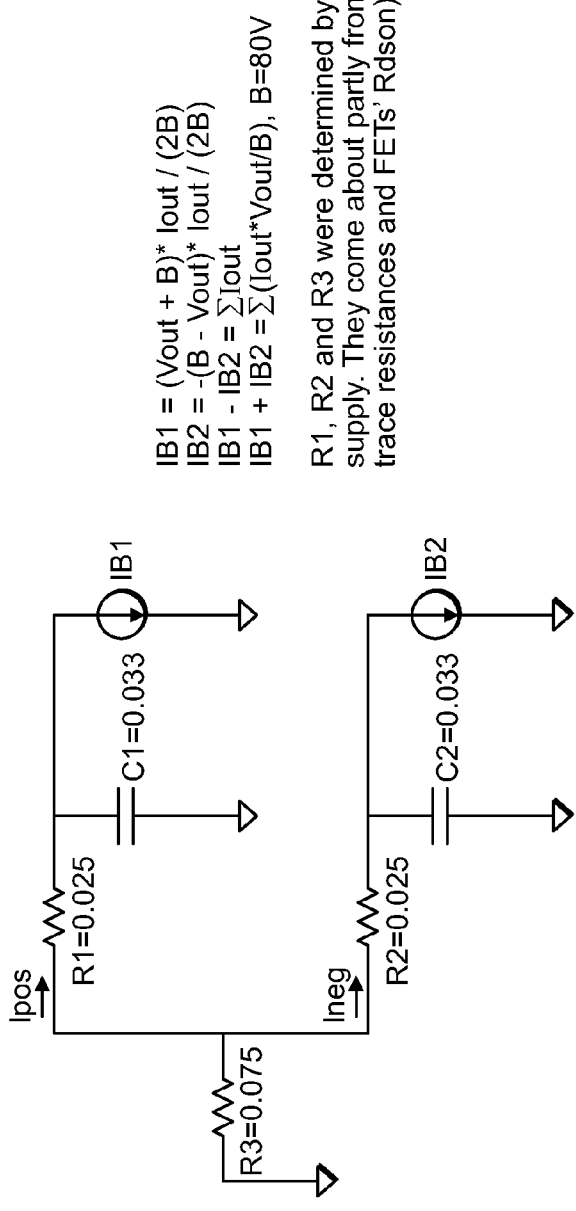

$IB1 = (Vout + B) * Iout / (2B)$
$IB2 = -(B - Vout) * Iout / (2B)$
$IB1 - IB2 = \sum Iout$
$IB1 + IB2 = \sum (Iout * Vout / B)$, $B=80V$ R1, R2 and R3 were determined by measurements on the power supply. They come about partly from real resistances (such as trace resistances and FETs' Rdson) and leakage inductances.

FIG. 10

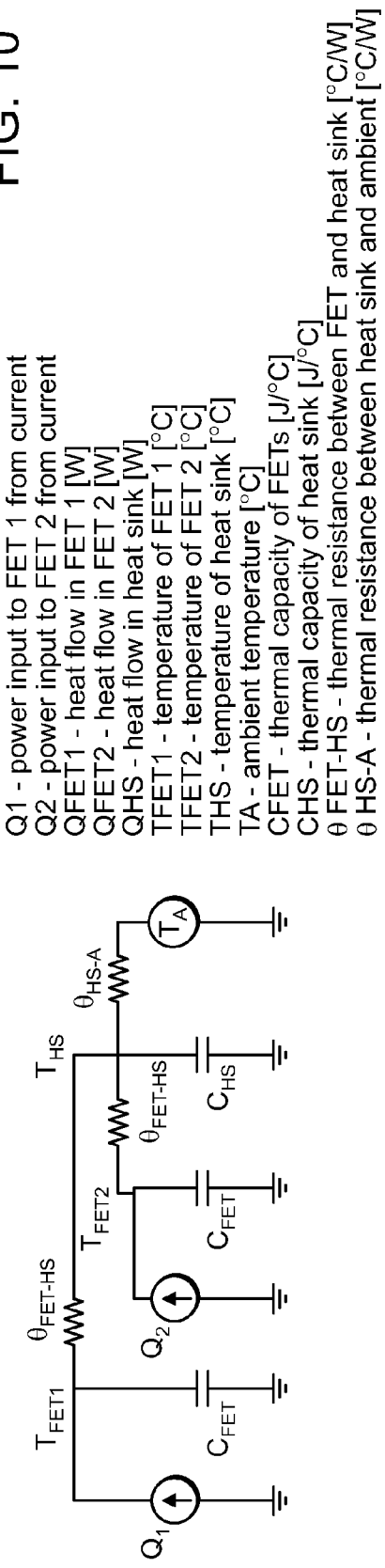

Q1 - power input to FET 1 from current
Q2 - power input to FET 2 from current
QFET1 - heat flow in FET 1 [W]
QFET2 - heat flow in FET 2 [W]
QHS - heat flow in heat sink [W]
TFET1 - temperature of FET 1 [°C]
TFET2 - temperature of FET 2 [°C]
THS - temperature of heat sink [°C]
TA - ambient temperature [°C]
CFET - thermal capacity of FETs [J/°C]
CHS - thermal capacity of heat sink [J/°C]
$\theta$ FET-HS - thermal resistance between FET and heat sink [°C/W]
$\theta$ HS-A - thermal resistance between heat sink and ambient [°C/W]

POWER SUPPLY WITH RECTIFIER PROTECTION

FIELD OF DISCLOSURE

This disclosure relates to audio amplifiers, and in particular, to power supplies for such amplifiers.

BACKGROUND

Known audio amplifiers include those in which amplifying units can be configured by a user to drive speakers. Since it is not known in advance how the user will ultimately connect the amplifying units, it can be difficult to know in advance how much current the power supply should be capable of handling.

It is possible to simply provide the power supply with components that can handle even the most taxing configurations. But such configurations are rarely encountered in practice. Therefore, it is economically wasteful to adopt such a solution.

SUMMARY

The invention is based in part on the recognition that there exists a need to protect a power supply against excessive current draw, but without having to over-engineer the amplifier.

In one aspect, the invention features an apparatus for driving speakers. Such an apparatus includes amplifier cells, each of being connected between first and second power rails. The amplifier cells are user-configurable for driving selected speakers. The apparatus also includes a synchronous rectifier circuit for providing current on the power rails for consumption by all the amplifier cells. This current depends on a user-defined configuration of the amplifier cells relative to the speakers. The apparatus further includes a control system for implementing a model of the synchronous rectifier circuit and the amplifier cells. This control system is configured to control an audio input signal in response to information concerning electrical outputs of the amplifier cells, thereby limiting current drawn from the synchronous rectifier circuit.

In some embodiments, the control system includes a feedback control system having two feedback loops. A first feedback loop is associated with electrical power processed by the synchronous rectifier circuit, and a second feedback loop is associated with controlling a temperature of the synchronous rectifier circuit.

In some embodiments, the model includes a thermal model for estimating a temperature based on an estimate of dissipated by the rectifier circuit. Among these embodiments are those in which the model further includes a temperature controller for receiving a difference between the estimated temperature provided by the thermal model and a maximum permissible temperature, and estimating, therefrom, a maximum power dissipation.

Additional embodiments are those in which the model includes a rectifier power dissipation model that provides an estimate of total power dissipated by the rectifier circuit as a function of the electrical outputs of the amplifier cells. Among these embodiments is a first set of embodiments which includes those embodiments in which the power dissipation model is configured to generate a first current by filtering the sum of the powers dissipated by each amplifier cell by a first time constant and to generate a second current by filtering the sum of the currents output from each amplifier cell by a second time constant that is shorter than the first time constant. Within this first set of embodiments is a second set of embodiments in which the power dissipation model is also configured to determine a first rail current by summing the first and second currents and to determine a second rail current by calculating a difference between the first and second current. Within this second set of embodiments is a third set of embodiments in which the power dissipation model is further configured to determine switching losses and conductive losses associated with the first rail current, and also to determine switching losses and conductive losses associated with the second rail current. Within this third set of embodiments is a fourth set of embodiments in which the power dissipation model is configured to output the larger of the sum of switching losses and conductive losses associated with the first rail current and the sum of the switching losses and conductive losses associated with the second rail current.

In another aspect, the invention features an apparatus for driving speakers. Such an apparatus includes amplifier cells, each of which is connected between a positive rail and a negative rail. The amplifier cells are user-configurable for driving selected speakers. The apparatus also includes a synchronous rectifier circuit for providing current on the positive rail and on the negative rail for consumption by the amplifier cells. This current depends on a user-defined configuration of the amplifier cells relative to the speakers. The apparatus also includes a rectifier power dissipation model that provides an estimate of total power dissipated by the rectifier circuit as a function of electrical outputs of the amplifier cells; a thermal model for estimating a temperature based on the estimate provided by the rectifier circuit; a temperature controller for receiving a difference between the estimated temperature provided by the thermal model and a maximum permissible temperature, and estimating, therefrom, a maximum permissible power dissipation; a power dissipation controller for receiving a difference between the maximum permissible power dissipation and the estimate of total power dissipated by the rectifier circuit; and a limiter for receiving a gain control signal from the power dissipation controller and applying the gain control to an audio signal to limit power dissipation by the synchronous rectifier circuit.

In some embodiments, the rectifier power dissipation model is configured to generate a slow current by filtering a sum of powers dissipated by each amplifier cell by a slow time constant and to generate a fast current by filtering a sum of currents output from each amplifier cell by a fast time constant. Among these embodiments are a first set of embodiments in which the power dissipation model is further configured to determine a positive-rail current by summing the slow current and the fast current, and to determine a negative-rail current by calculating a difference between the slow current and the fast current. Among the embodiments in this first set are those in a second set of embodiments, in which the power dissipation model is further configured to determine switching losses and conductive losses associated with the positive-rail current, and determine switching losses and conductive losses. Within this second set of embodiments is a third set of embodiments, which includes those embodiments in which the power dissipation model is configured to output the larger of a sum of the switching losses and conductive losses associated with the first rail current, and a sum of the switching losses and conductive losses associated with the second rail current.

In another aspect, the invention features an apparatus for driving speakers. Such an apparatus includes a plurality of amplifier cells, each of which is connected between a first power rail and a second rail. These amplifier cells are user-configurable for driving selected speakers. The apparatus further includes means for providing current for consumption by all the amplifier cells. This current depends on a user-defined configuration of the amplifier cells relative to the speakers. Also included in the apparatus is a means for controlling the means for providing current to limit current provided by the means for providing current in response to information concerning electrical outputs of the amplifier cells.

Among the embodiments of the apparatus are those in which the means for controlling includes means for controlling an input audio signal in response to the information concerning the electrical output.

These and other features of the invention will be apparent from the following detailed description, and the accompanying figures, in which:

DESCRIPTION OF THE FIGURES

FIG. 9 is a dynamic model of the power supply shown in FIG. 2; and

FIG. 10 is a thermal model used in the control system used in FIG. 6.

DETAILED DESCRIPTION

Figure 1:
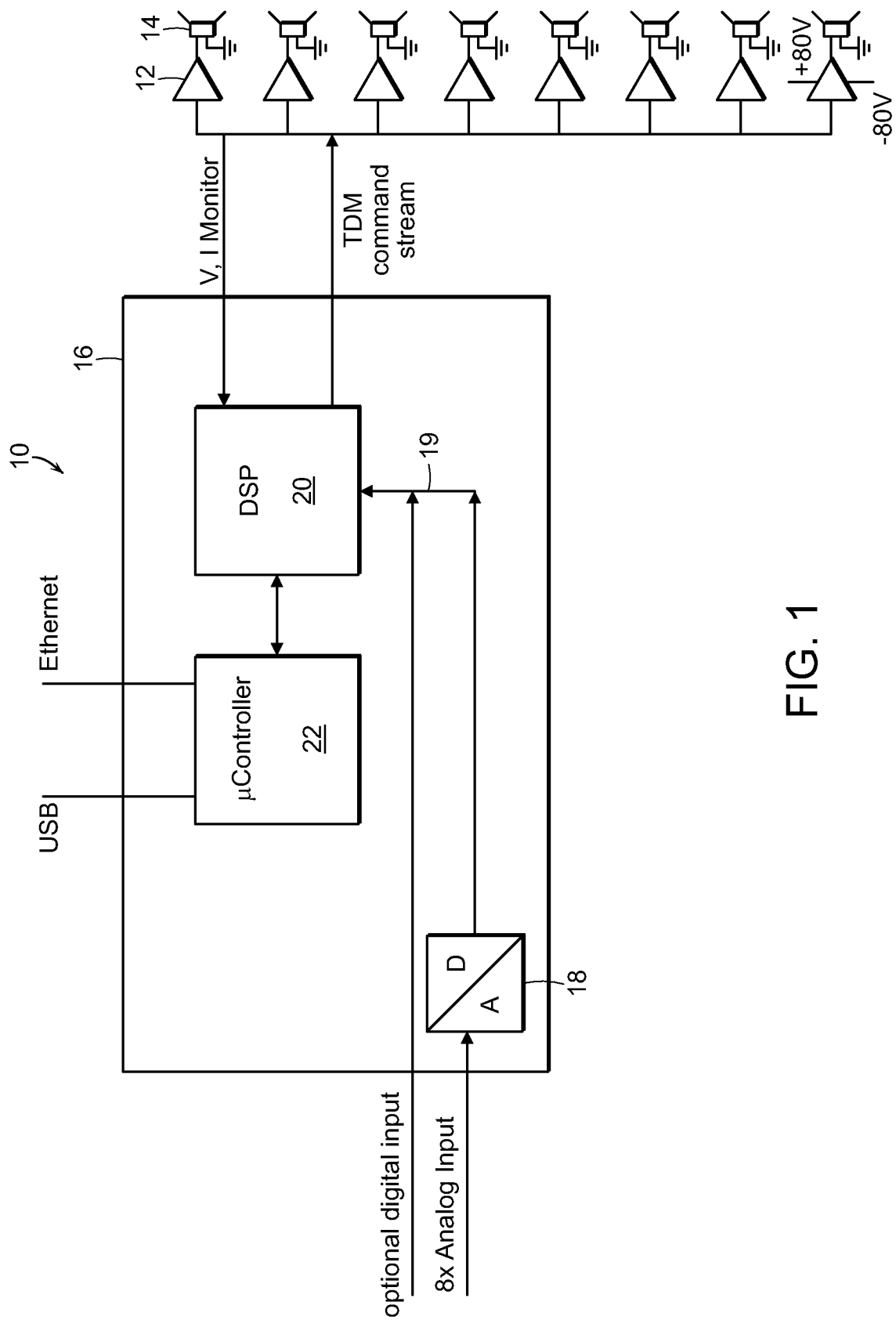
FIG. 1 shows an amplifier configured to drive a set of speakers.

FIG. 1 shows an amplifier 10 having multiple half bridge unit amplifier cells 12 that can be configured by a user to drive multiple speakers 14 in various configurations. The particular example shows eight amplifier cells 12 each of which drives a corresponding speaker 14 in a half-bridge configuration. Such an amplifier 10 is described in more detail in U.S. application Ser. No. 12/717,198, filed on Mar. 4, 2010 and entitled "Versatile Audio Power Amplifier," the contents of which are herein incorporated by reference.

The amplifier cells 12 are controlled by a control system 16 that either converts analog input into a digital input using an A/D converter 18, or receives a digital input directly. In either case, a digital audio input 19 is ultimately provided to a digital signal processor (DSP) 20 controlled by a microcontroller 22. The DSP 20 provides time-division multiplexing ("TDM") commands to the amplifier cells 12 and also receives, from each amplifier cell 12, information about the electrical output (i.e. voltage and current) of that cell 12. The amplifier cells 12 receive power via a shared positive rail 24 and a shared negative rail 26.

Figure 2:
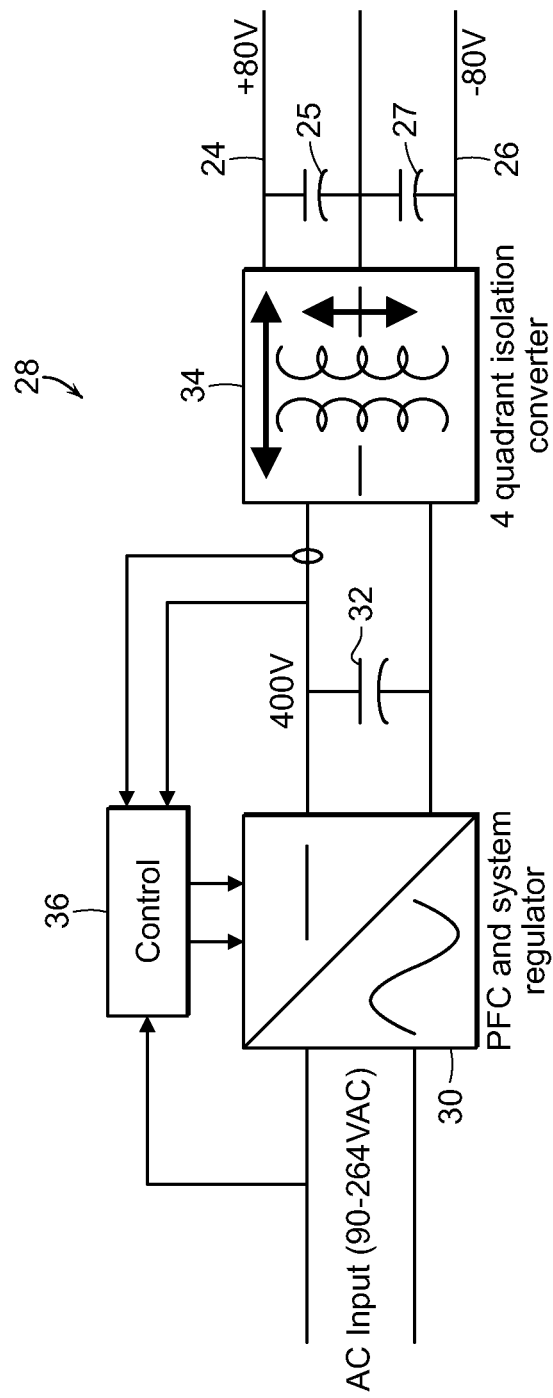
FIG. 2 shows a power supply for the amplifier of FIG. 1.

Referring to FIG. 2, a power supply 28 maintains each of these rails 24, 26 at an operating voltage. In the embodiment shown, the operating voltages are +80 volts and −80 volts. In particular, first and third rectifier transistors 44A, 44C process power on the positive rail 24, while second and fourth rectifier transistors 44B, 44D process power on the negative rail 26.

The power supply 28 features a power factor correction block 30 that eliminates non-sinusoidal components from an AC input and outputs a boosted DC voltage across a capacitor 32. This DC voltage becomes the input to a four quadrant isolation converter 34, the details of which are shown in more detail in FIG. 3. The isolation converter 34 maintains a voltage across the positive and negative rails 24, 26, shown in FIG. 3 with their respective intrinsic capacitances, 25, 27.

A controller 36 controls operation of the power factor correction block 30 based on monitored values of its input and output. In the typical embodiment shown, the power factor correction block 30 accepts an AC input between 90 and 264 VAC and provides a 400 V DC signal across the capacitor 32.

Figure 3:
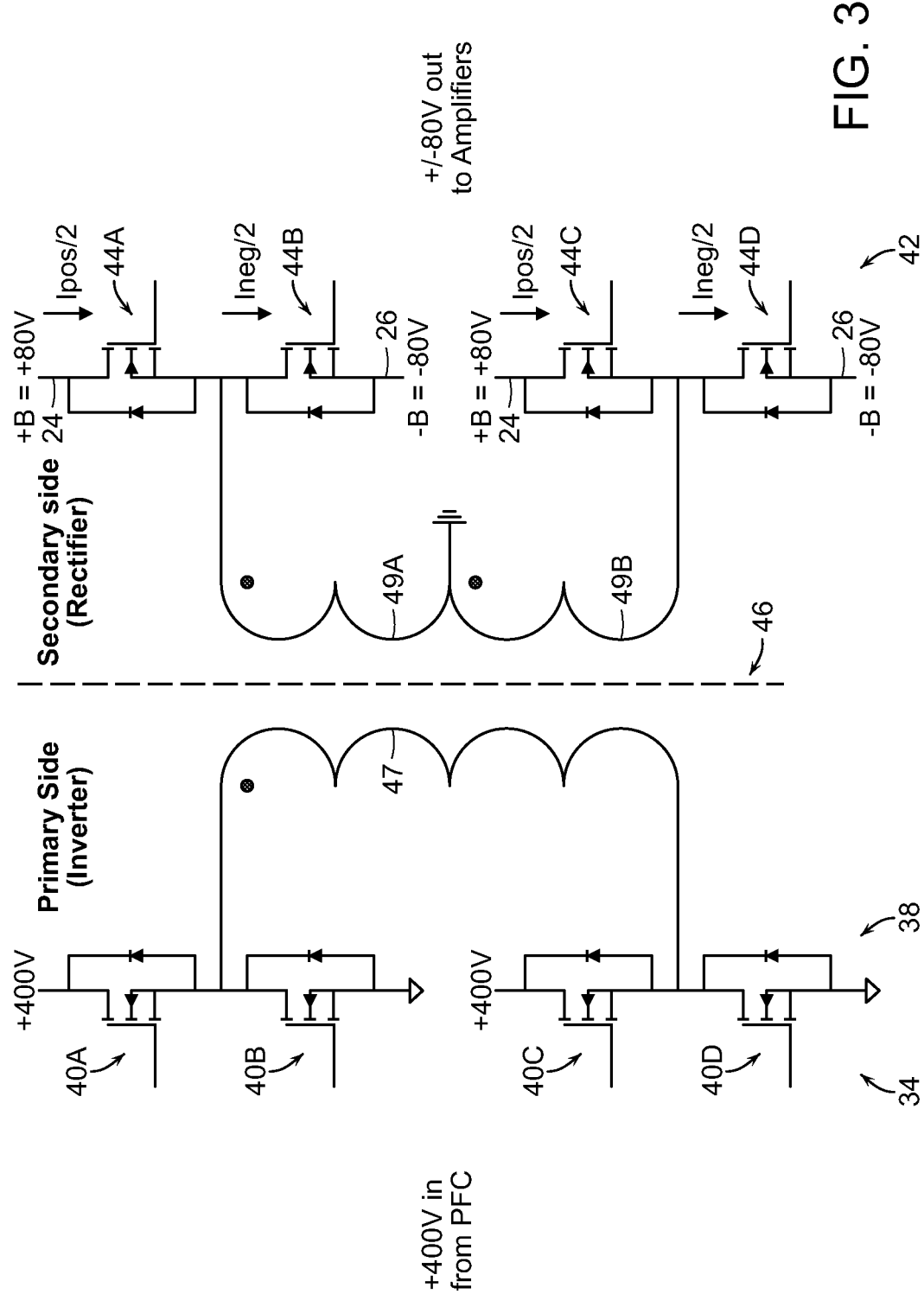
FIG. 3 shows a four-quadrant isolation converter used in the power supply of FIG. 2.

Referring next to FIG. 3, the isolation converter 34 features an input inverter 38 having four inverter field-effect transistors (FETs) 40A-D that switch on and off in a coordinated way to convert the DC voltage provided by the power factor correction block 30 into an AC voltage. This AC voltage couples to an output rectifier 42 having four rectifier transistors 44A-D across a transformer 46 having a primary winding 47 and two secondary windings 49A-B. The four rectifier transistors 44A-D likewise switch on and off in a coordinated manner to place an output DC voltage across the positive and negative rails 24, 26. In particular, first and third rectifier transistors 44A, 44C process power on the positive rail 24 and second and fourth rectifier transistors 44B, 44D process power on the negative rail 26.

A difficulty that arises in certain configurations of the amplifier cells 12 impose considerable thermal stress on the four rectifier transistors 44A-D. For example, in a sensible configuration, low frequency sources would be driven across a pair of amplifier cells 12 connected as a bridge-tied load ("BTL") pair. However, because the amplifier 10 is freely configurable by a user, nothing in principle would prevent the user from configuring the amplifier cells 12 as shown in FIG. 1 and applying a bass-rich signal long enough to overheat the output rectifier 42.

Figure 4:
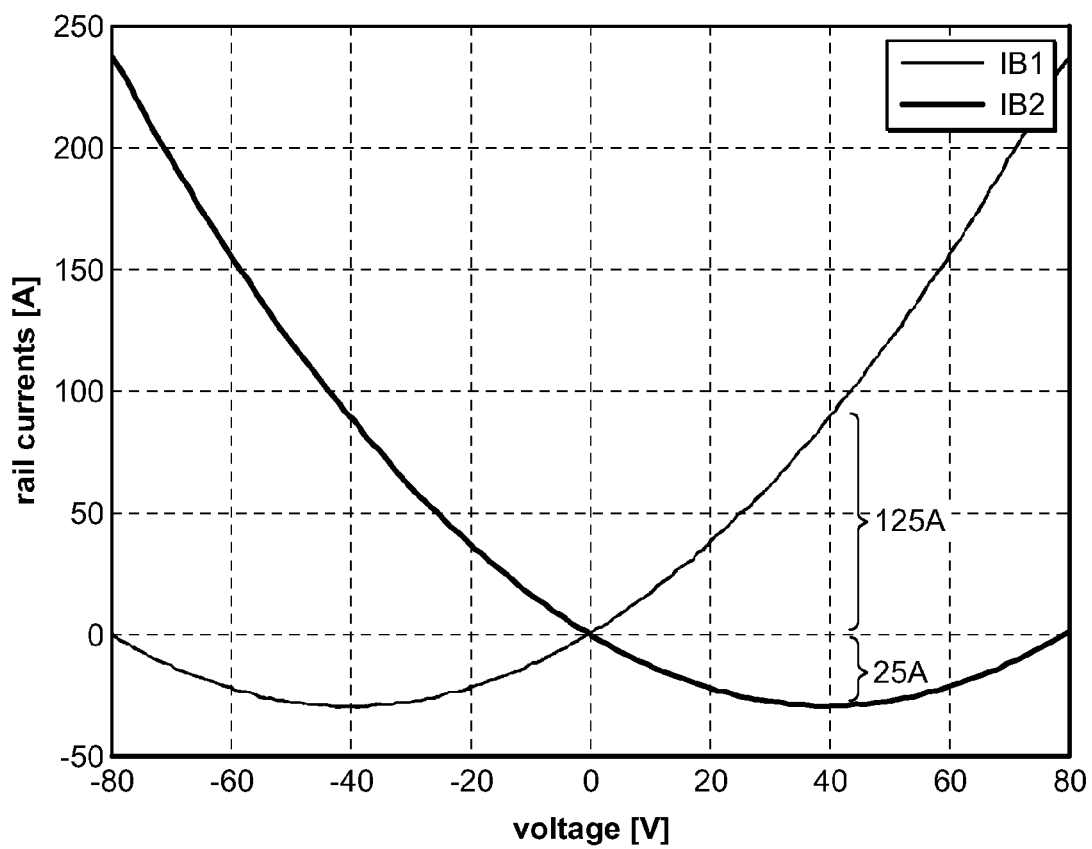
FIG. 4 shows current on positive and negative rails drawn by the amplifier cells of FIG. 1.

FIG. 4 illustrates the difficulty that can arise in one example. The vertical axis of FIG. 4 represents the sum of all currents drawn by the amplifier 10 as a function of output amplifier voltage. when driving a worst-case load (about 2.7 ohms). With the output amplifier voltage at approximately 50 volts, an 80 volt positive rail 24 would source approximately 125 amps, while at the same time, approximately an additional 25 amps is sunk on the negative rail 26. Thus, the output rectifier 42 would process approximately 12 kilowatts of power. If high frequencies dominate the spectrum of the audio signal, much of the current would be sourced by bus capacitances downstream from the output rectifier 42. However, as discussed below in connection with FIG. 9, in the event that low frequencies dominate the spectrum, much of this current would pass through the rectifier transistors 44A-D. This current can overheat, and possibly damage, the rectifier transistors 44A-D.

One approach to overcoming this difficulty would be to simply design the rectifier 42 to handle larger currents with ease. This can be done by using rectifier transistors 44A-D with higher current ratings, larger heat sinks, fans, and even liquid cooling systems.

On the other hand, the configuration shown in FIG. 1 would not be regarded as good practice to begin with. Under these circumstances, it would seem wasteful to accommodate this and other unusual configurations using expensive and bulky components.

Another approach to overcoming the foregoing difficulty would be to measure the rectifier current and to provide some mechanism for limiting dangerously high values of that current. However, rectifier currents can be quite large, on the order of hundreds of amperes. Current sensors for measuring such currents would be large and expensive.

Yet another approach to overcoming the above difficulty is to exploit the information already being provided to the control system 16 concerning the electrical output at each of the amplifier cells 12, as shown in FIG. 1. Given an appropriate model, this information can be used to obtain a real time estimate of current supplied by the rectifier 42.

Figure 5:
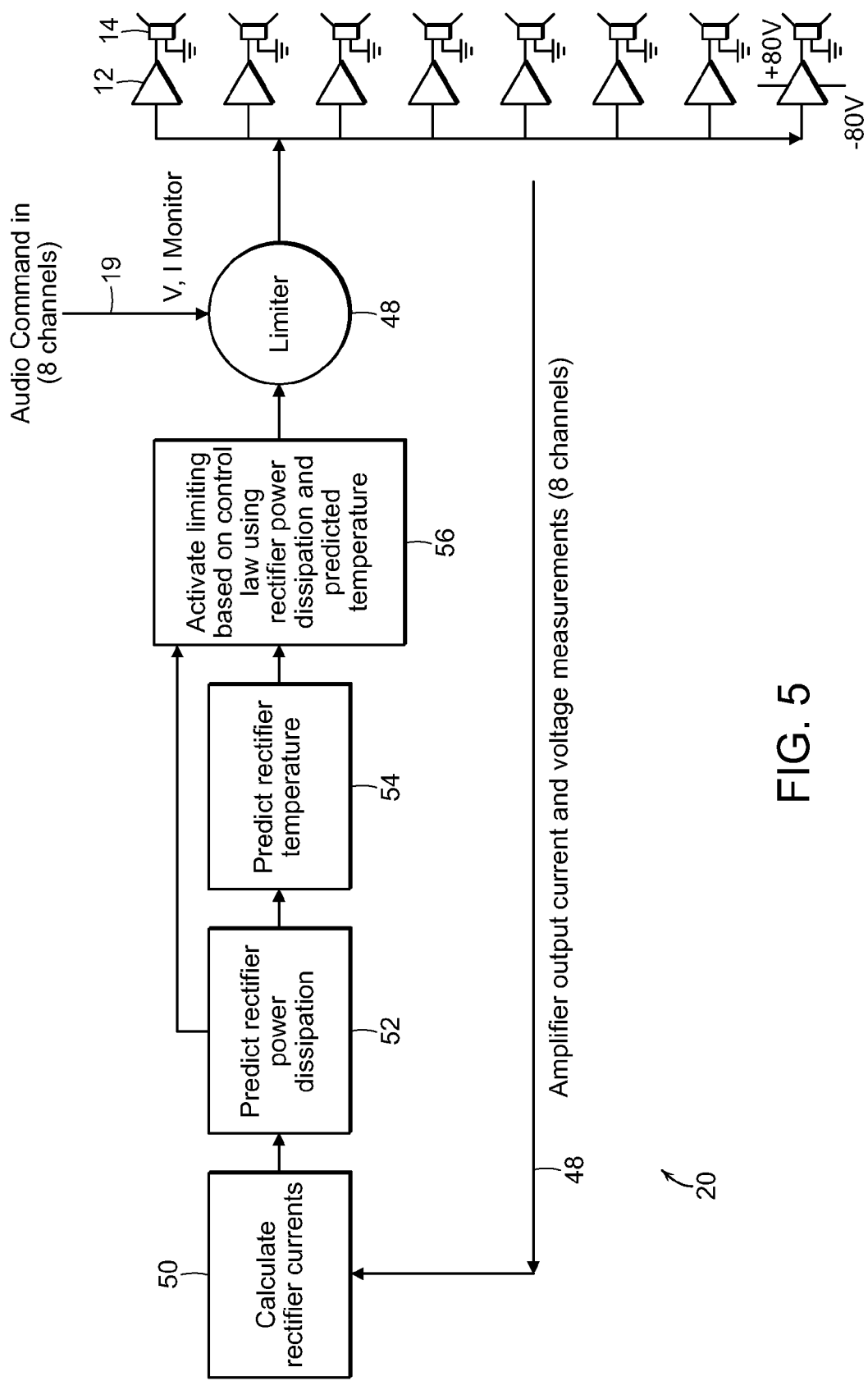
FIG. 5 shows steps in determining whether to limit the output of the rectifier shown in FIG. 3.

As shown in FIG. 5, the individual output voltage and current measurements 48 provided to the control system 16 are used to calculate the current drawn from the output rectifier 42 (step 50). Based on this estimate, a prediction is made (step 52) concerning the power dissipated by the output rectifier 42. This prediction is then used, in conjunction with a model of the rectifier's properties and those of its associated power dissipation system, to predict the rectifier's operating temperature (step 54). Using both the prediction of the rectifier's power dissipation and that of its operating temperature, a decision is made (step 56) concerning whether or not to control or limit the audio input signal 19 to limit current drawn from the output rectifier 42. This decision is then provided to a limiter 58 as needed.

Figure 6:
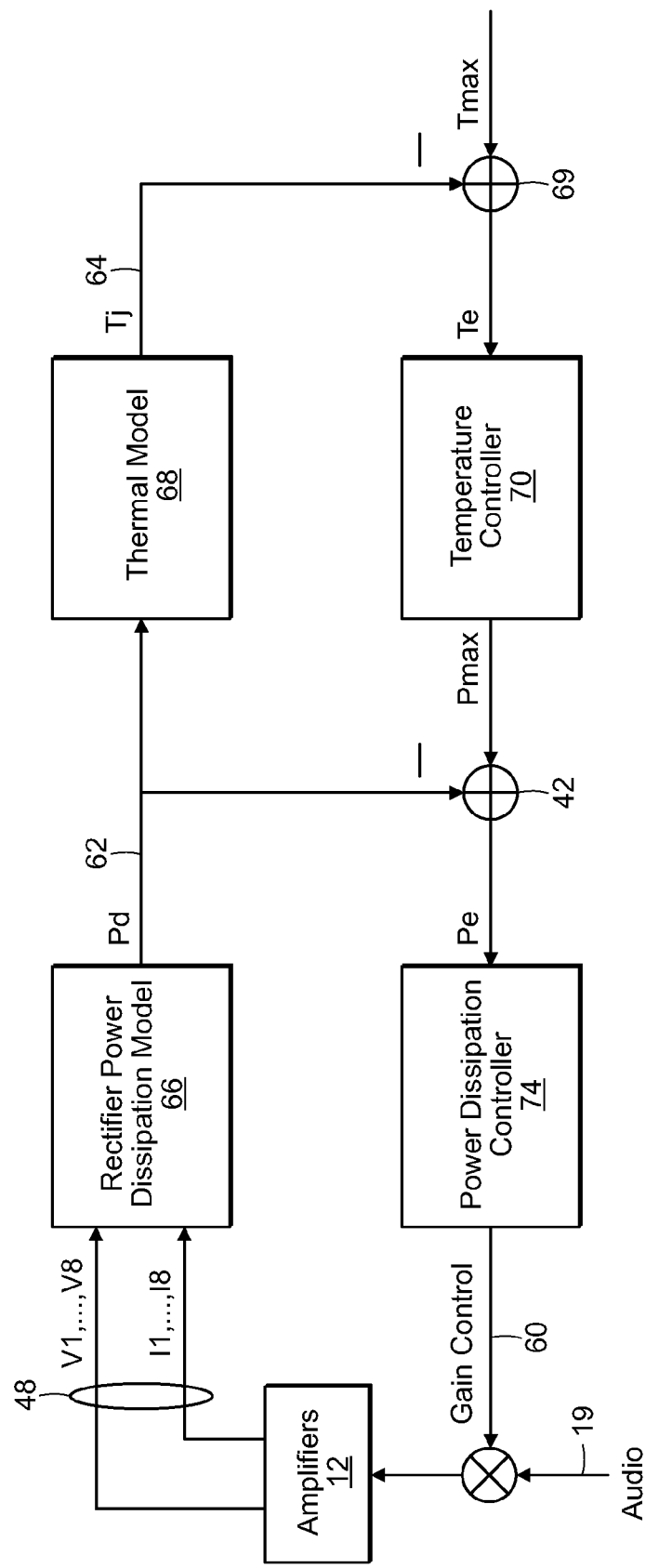
FIG. 6 is a block diagram of a feedback control system for controlling the output of the rectifier shown in FIG. 3.

FIG. 6 shows a nested feedback loop implemented by the control system 16 to regulate the temperature of the output rectifier 42. The feedback loop outputs an audio gain reduction factor 60 to be applied to all amplifier cells 12 simultaneously. This audio gain reduction factor 60 is calculated based on both the power dissipated 62 by the output rectifier 42 and on a predicted die temperature 64 of the rectifier transistors 44A-D.

In the illustrated feedback loop, measurements 48 of voltage and current from each amplifier cell 12 are provided to a rectifier power dissipation model 66. Based on these measurements, the rectifier power dissipation model 66 determines the total electrical power being processed by the rectifier transistors 44A-44D and estimates the thermal power, Pd, being dissipated by the rectifier transistors 44A-44D during the course of processing that electrical power. This estimate is provided to a thermal model 68 that estimates the junction temperatures at each of the rectifier transistors 44A-D. The highest of these temperatures, $T_j$, is the output of the thermal model 68. This output is provided to a first summing node 69 that compares it with a maximum temperature, $T_{max}$. The difference between the two, $T_e$, is provided to a temperature controller 70, which calculates based on that difference the maximum power, $P_{max}$, that should be dissipated by the rectifier 42.

The thermal model 68, the first summing node 69, and the temperature controller 70 thus form the outer loop. This outer loop ensures that an estimate of the highest junction temperature, $T_j$, within a rectifier transistor 44A-D never exceeds a specified upper limit, $T_{max}$.

The estimate 62 of power dissipated from the rectifier power dissipation model 66 is also provided to a second summing node 72, where it is compared with the maximum permissible power dissipation, as calculated by the outer loop. The difference between the two provides a basis for a power dissipation controller 74 to choose a gain reduction factor 60 to apply to all amplifier cells 12. This gain reduction factor 60 ranges from zero to one. It takes on the value of unity when the power being dissipated is less than the maximum permitted power dissipation.

The second summing node 72 and the power dissipation controller 74 thus define an inner loop. This inner loop does not directly control temperature. It simply ensures that the rectifier 42 always dissipates an amount of power that is less than an allowable maximum value. This maximum value, meanwhile, comes from the outer loop.

A variety of ways can be used to implement the rectifier power dissipation model 66 shown in FIG. 6. However, in at least one embodiment, shown in FIG. 7, the individual voltage and current measurements 48 are combined to generate a "slow" current and a "fast" current. The sum of the slow and fast currents is the total current provided by the rectifier 42 on the positive rail 24; the difference between the slow and fast components is the total current provided by the rectifier 42 on the negative rail 26.

The terms "slow" and "fast" arise from the dynamics of energy transfer within the four quadrant isolation converter 34, shown in FIG. 3. In particular, the fast time constant arises from energy transferred between the positive and negative rails 24, 26, whereas the slow time constant arises from energy transferred across the transformer 46 from the primary winding 47 to the secondary windings 49A, 49B. As discussed below and shown in FIG. 7, the slow time constant is used to derive the slow current and the fast time constant is used to derive the fast current.

The slow current is proportional to the amplifier's total power output. This slow current causes real power to be drawn from the rectifier 42. The fast current corresponds to the total current output of all amplifier cells 12. This fast current circulates through the rectifier 42 and causes heating of the rectifier transistors 44A-D and the transformer 46, but not of the power supply 28 as a whole. It is this current that is reduced when a speaker 14 is driven in a full bridge configuration rather than a half bridge configuration, and it is primarily for this reason that rectifier heating tends to be lower when a speaker 14 is driven by a fully bridged amplifier.

Figure 7:
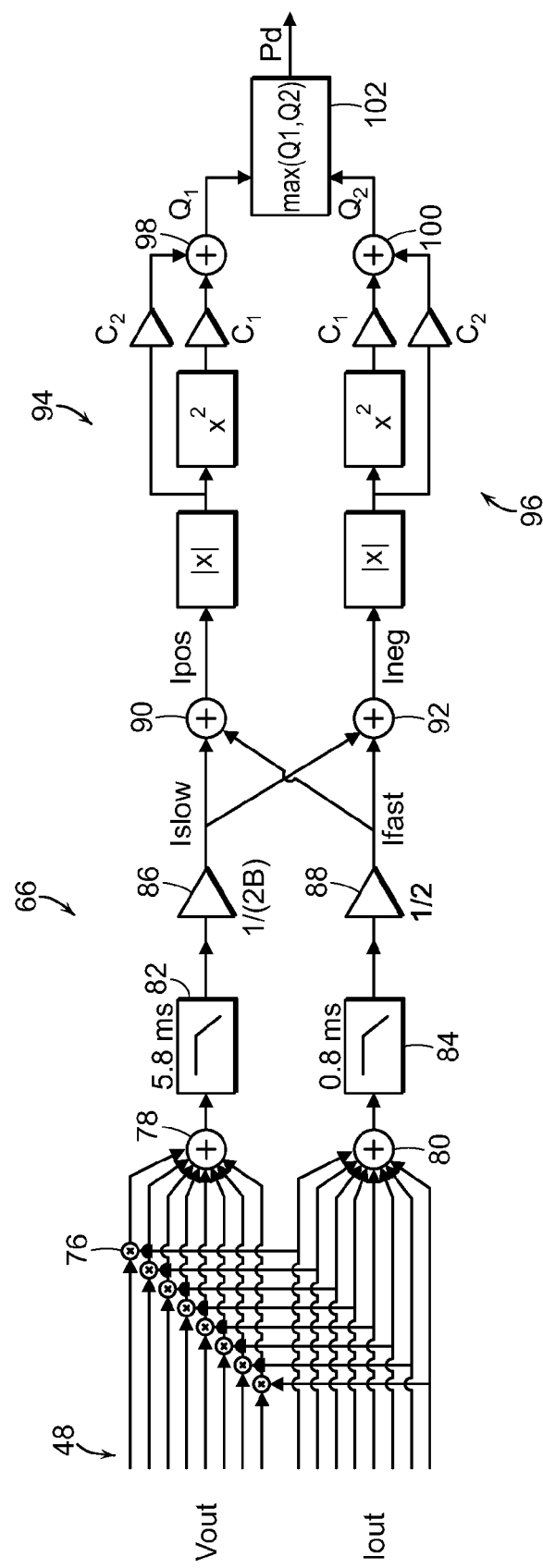
FIG. 7 is a diagram of a rectifier power dissipation model suitable for incorporation into the feedback control system of FIG. 6.
Figure 8:
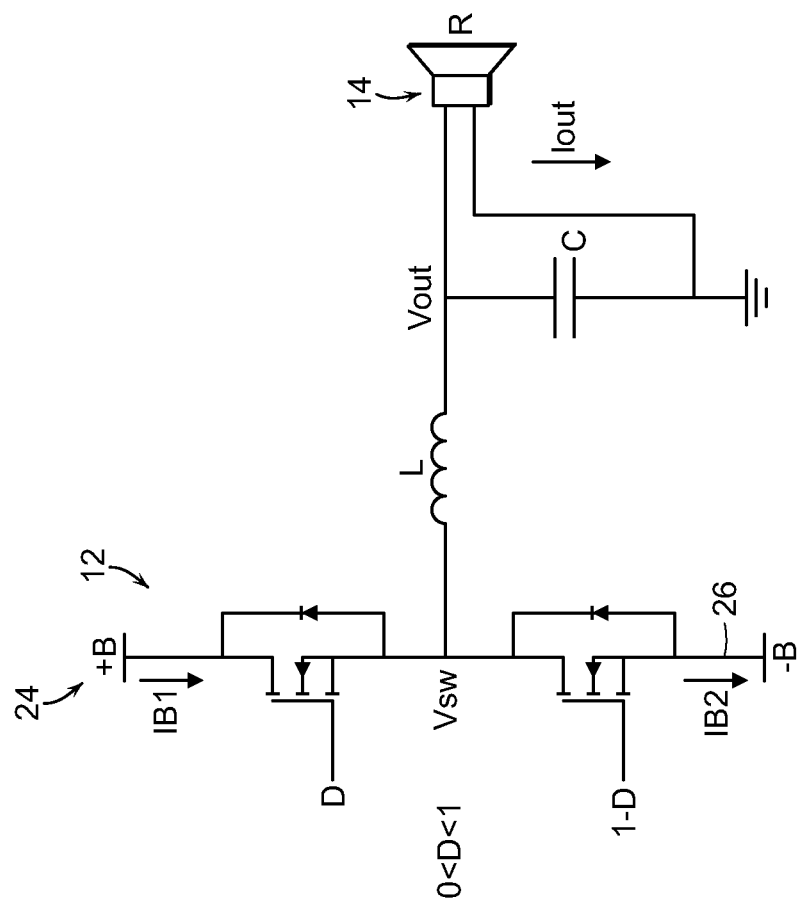
FIG. 8 shows an amplifier cell from FIG. 1 driving a speaker.

Referring now to FIG. 7, the rectifier power dissipation model 66 includes multipliers 76, one for each amplifier cell 12, for multiplying voltage and current from each amplifier cell 12 to obtain that cell's power output. The resulting individual powers from each amplifier cell 12 are summed together at a first summer 78 to generate a total power. Meanwhile, the individual currents at each amplifier cell 12 are summed together at a second summer 80 to generate a total current.

The total power and total current are each weighted by different time constants. In particular, the total power is weighted by the slow time constant 82 whereas the total current is weighted by the fast time constant 84. In a typical embodiment, the slow time constant is approximately 5.8 ms and the fast time constant is approximately 0.8 ms. Details concerning where these time constants originate are provided below.

First and second scaling modules 86, 88 then scale the weighted total power and current to yield the slow and fast currents respectively. The first scaling module 86 scales its input by the inverse of the voltage difference between the negative and positive rail, 2B, to convert power back into current.

A first summer 90 then combines the slow and fast currents to determine the current, $I_{pos}$, on the positive rail 24. Meanwhile, a second summer 92 evaluates a difference between the slow and fast currents to determine the current, $I_{NEG}$, on the negative rail 26.

The first and second time constants can be derived from consideration of FIG. 9, which models the dynamics of the four-quadrant isolation converter 34 shown in FIG. 3. In FIG. 9, the current IB1 represents the sum of the currents drawn from the positive rail 24 by all of the amplifier cells 12, and the current IB2 represents the sum of the currents drawn from the negative rail 26 by all of the amplifier cells 12. Capacitances C1 and C2 represent the total bus filter capacitance on the rails 24, 26. The resistances R1, R2 and R3 represent the effective coupling impedance imposed by the resistance and leakage inductance of the transformer 46 and the resistance of the transistors in the isolation converter 34. The real resistances combine with the leakage inductances of the transformer which, at the typical operating frequency of 350 kHz, look like lossless resistors (i.e., a component in which voltage is proportional to current, but no power is dissipated). These impedances and capacitances act together to produce a system with a slow and a fast time constant.

Because of large bypass capacitors C1 and C2 between the rails 24, 26 and ground, and because of the effective coupling impedances R1, R2 and R3, associated with the transformer 46, the rail currents supplied by the rectifier transistors 44A-D, Ipos and Ineg are filtered versions of the currents actually on the rails 24, 26, namely IB1 and IB2. At low frequencies, Ipos and Ineg are almost the same as IB1 and IB2. This means that most of the current will be supplied from the rectifier transistors 44A-D. At high frequencies, most of the current will be supplied from the intrinsic rail capacitances C1 and C2. It is in part for this reason that sustained low frequency audio signals pose difficulty for the rectifier transistors 44A-D.

The fast time constant comes from the loop in FIG. 9 that includes the rail capacitances C1 and C2, and the impedances coupling the two rails, R1 and R2. Assuming a total resistance of 0.05 ohms and a capacitance of 0.0167 farads, the time constant is (R1+R2)*(C1*C2/(C1+C2)), or 0.8 ms. The slow time constant comes from a loop in FIG. 9 that also includes R3, the impedance coupling the secondary windings 49A, 49B to the primary winding 47. This time constant is (R1*R21(R1+R2)+R3)*(C1+C2), which, for R3=0.075 ohms, yields a time constant of 5.8 ms. These time constants are long enough so that frequency components above about 1 kHz contribute very little to the peak currents, thus reducing the rate at which computations need to be performed.

Referring again to FIG. 7, two power loss models 94, 96 model the power dissipated in the rectifier transistors 44A-D as a sum of conduction losses and switching losses. The conduction loss is modeled as the product of the square of the current magnitude and a first constant, C1. The switching loss is modeled as the product of a second constant, C2, and the magnitude of the current. The first constant depends on the drain-source resistance Rds(on) of the rectifier transistors 44A, 44B, 44C, 44D and is corrected for duty cycle, which is usually about 40% on and 60% off. The second constant depends on switching frequency, rail voltage, and switching time, with switching time usually being obtained from measurements. The conduction loss and switching loss for the first and third rectifier transistors 44A, 44C, which are associated with the positive rail 24, and similar losses for the second and fourth rectifier transistors 44B, 44D associated with the negative rail 26, are combined at corresponding third and fourth summers 98, 100. The power dissipated by the transistors on the positive rail 24 and the power dissipated by the transistors on the negative rail 26 are then compared at a comparator 102. The larger of the two becomes the output of the rectifier dissipation model 66 shown in FIG. 6.

The overall transfer function of the rectifier power dissipation mode 66 is a decidedly nonlinear one. The nonlinearity has a multiplicative component that affects the amplitude of the signal and an absolute component that shifts frequency up by a factor of two or higher. The first component can be dealt with by small signal modeling at different operating points, but the second component cannot.

One approach to determining the overall transfer function is to assume that the frequency nonlinearity amounts to only a doubling of frequency, and to continue to use small signal models for different operating points subject to that assumption. This would provide a corresponding transfer function at each operating point. If the dynamic response does not change significantly within a 6-12 dB frequency range, such a model can then be used as a reasonable starting point for conservative controller design, which can then be further tuned in simulations with a full nonlinear model.

Referring back to FIG. 6, the power dissipation controller 74 that ultimately relies on the output of the power dissipation model 66 is typically a proportional-integral controller. To ensures that it also works for the lower operating points, the power dissipation controller 74 is designed for the highest of the foregoing operating points. The power dissipation controller rectifier 74 can then be further tuned in full scale nonlinear simulations for optimal performance (i.e. a higher bandwidth and higher open loop gain at low frequencies). The resulting controller 74 can be expected to achieve over 100 Hz of 3 dB bandwidth.

The thermal model 68 can be modeled as an equivalent electric circuit, as shown in FIG. 10. In the thermal model 68 shown in FIG. 10, power corresponds to current and voltage corresponds to temperature. The capacitance $C_{FET}$ and inductance $THETA_{FET-Hs}$ are first order approximations of the thermal impedance between the junction in a rectifier transistor 44A-D and its corresponding heat sink. This thermal impedance is obtained from the transistor's device data sheet.

Referring back to FIG. 6, for simplicity, the temperature controller 70 can be a proportional controller since the maximum temperature $T_{max}$ is fixed, and can be set to account for DC error arising from limited low frequency gain. The temperature controller 70 can thus be tuned for a narrow bandwidth of 2-3 Hz.

Having described the invention, and a preferred embodiment thereof, what is claimed as new and secured by Letters Patent is:

1. An apparatus for driving speakers, said apparatus comprising:
    amplifier cells, each of the cells being connected between a first and second power rail, the amplifier cells being user-configurable for driving selected speakers;
    a synchronous rectifier circuit for providing current on the power rails for consumption by all the amplifier cells, said current being dependent on a user-defined configuration of said amplifier cells relative to said speakers; and
    a control system for implementing a model of said synchronous rectifier circuit and said amplifier cells, said control system being configured to control an audio input signal in response to information concerning electrical outputs of the amplifier cells, thereby limiting current drawn from the synchronous rectifier circuit; wherein said model comprises a rectifier power dissipation model that provides an estimate of total power dissipated by said rectifier circuit as a function of the electrical outputs of the amplifier cells.

2. The apparatus of claim 1, wherein the control system comprises a feedback control system having a first feedback loop associated with electrical power processed by said synchronous rectifier circuit, and a second feedback loop associated with controlling a temperature of the synchronous rectifier circuit.

3. The apparatus of claim 1, wherein the model comprises a thermal model for estimating a temperature based on an estimate of dissipated by said rectifier circuit.

4. The apparatus of claim 3, wherein said model further comprises
a temperature controller for receiving a difference between said estimated temperature provided by said thermal model and a maximum permissible temperature, and estimating, therefrom, a maximum power dissipation.

5. The apparatus of claim 1, wherein said power dissipation model is configured to
generate a first current by filtering the sum of the powers dissipated by each amplifier cell by a first time constant and
generate a second current by filtering the sum of the currents output from each amplifier cell by a second time constant,
said second time constant being shorter than said first time constant.

6. The apparatus of claim 5, wherein said power dissipation model is further configured to
determine a first rail current by summing said first and second currents and
determine a second rail current by calculating a difference between said first and second current.

7. The apparatus of claim 6, wherein said power dissipation model is further configured to
determine switching losses and conductive losses associated with the first rail current, and
determine switching losses and conductive losses associated with the second rail current.

8. The apparatus of claim 7, wherein said power dissipation model is configured to output the larger of
the sum of switching losses and conductive losses associated with the first rail current and
the sum of the switching losses and conductive losses associated with the second rail current.

9. An apparatus for driving speakers, said apparatus comprising:
amplifier cells, each of said amplifier cells being connected between a positive rail and a negative rail, said amplifier cells being user-configurable for driving selected speakers;
a synchronous rectifier circuit for providing current on said positive rail and on negative rail for consumption by said amplifier cells, said current being dependent on a user-defined configuration of said amplifier cells relative to said speakers;
a rectifier power dissipation model that provides an estimate of total power dissipated by said rectifier circuit as a function of electrical outputs of the amplifier cells;
a thermal model for estimating a temperature based on said estimate provided by said rectifier circuit;
a temperature controller for receiving a difference between said estimated temperature provided by said thermal model and a maximum permissible temperature, and estimating, therefrom, a maximum permissible power dissipation;
a power dissipation controller for receiving a difference between the maximum permissible power dissipation and the estimate of total power dissipated by the rectifier circuit; and
a limiter for receiving a gain control signal from said power dissipation controller and applying said gain control to an audio signal to limit power dissipation by said synchronous rectifier circuit.

10. The apparatus of claim 9, wherein said rectifier power dissipation model is configured to
generate a slow current by filtering a sum of powers dissipated by each amplifier cell by a slow time constant and
generate a fast current by filtering a sum of currents output from each amplifier cell by a fast time constant.

11. The apparatus of claim 10, wherein said power dissipation model is further configured to
determine a positive-rail current by summing said slow current and said fast current, and
determine a negative-rail current by calculating a difference between said slow current and said fast current.

12. The apparatus of claim 11, wherein said power dissipation model is further configured to
determine switching losses and conductive losses associated with said positive-rail current, and
determine switching losses and conductive losses.

13. The apparatus of claim 12, wherein said power dissipation model is configured to output the larger of
a sum of said switching losses and conductive losses associated with the first rail current, and
a sum of said switching losses and conductive losses associated with the second rail current.

14. An apparatus for driving speakers, said apparatus comprising:
a plurality of amplifier cells, each of said amplifier cells being connected between a first power rail and a second rail, said amplifier cells being user-configurable for driving selected speakers;
means for providing current for consumption by all the amplifier cells, said current being dependent on a user-defined configuration of said amplifier cells relative to said speakers; and
means for controlling said means for providing current, wherein said means for controlling limits said current provided by said means for providing current in response to information concerning electrical outputs of said amplifier cells; wherein said model comprises a rectifier power dissipation model that provides an estimate of total power dissipated by said rectifier circuit as a function of the electrical outputs of the amplifier cells.

15. The apparatus of claim 14, wherein said means for controlling comprises means for controlling an input audio signal in response to said information concerning said electrical output.

* * * * *

UNITED STATES PATENT AND TRADEMARK OFFICE
CERTIFICATE OF CORRECTION

PATENT NO. : 9,054,658 B2  
APPLICATION NO. : 13/107267  
DATED : June 9, 2015  
INVENTOR(S) : Nussbaum et al.

Page 1 of 1

It is certified that error appears in the above-identified patent and that said Letters Patent is hereby corrected as shown below:

In the drawings,

Sheet 7, Fig. 7, add a negative sign "-" just below and to the left of the second summer 92.

In the claims,

Column 8, claim 3, line 67, insert --total power-- before "dissipated".

Column 9, claim 6, line 22, replace "second current" with "second currents".

Column 9, claim 9, line 42, replace "on negative" with "said negative".

Column 9, claim 9, line 50, replace "rectifier circuit" with "rectifier power dissipation model".

Column 10, claim 12, line 25, after "conductive losses" add "associated with said negative rail current".

Column 10, claim 13, line 29, replace "first" with "positive".

Column 10, claim 13, line 31, replace "second" with "negative".

Column 10, claim 14, line 35, after "second" add "power".

Column 10, claim 14, line 43, before "limits" add "implements a model of said means for providing current, and".

Column 10, claim 15, line 53, replace "output" with "outputs".

Signed and Sealed this  
Twenty-third Day of August, 2016

Michelle K. Lee  
*Director of the United States Patent and Trademark Office*